(12) United States Patent
Ikura

(10) Patent No.: US 6,465,112 B2
(45) Date of Patent: Oct. 15, 2002

(54) METHOD FOR FABRICATING SEMICONDUCTOR DEVICE

(75) Inventor: Tsuneo Ikura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/942,906

(22) Filed: Aug. 31, 2001

(65) Prior Publication Data

US 2002/0052106 A1 May 2, 2002

(30) Foreign Application Priority Data

Oct. 31, 2000 (JP) ......................................... 2000-332057

(51) Int. Cl.$^7$ ......................................... H01L 21/4763
(52) U.S. Cl. ...................... 428/624; 438/622; 438/618; 438/780; 257/759; 257/760
(58) Field of Search ................................ 438/622–625, 438/637, 639, 780, 783, 618; 257/759, 760

(56) References Cited

U.S. PATENT DOCUMENTS

2001/0015499 A1 * 8/2001 Juasa ........................ 257/759

FOREIGN PATENT DOCUMENTS

JP        11135620   *  5/1999   ......... H01L/21/768

* cited by examiner

*Primary Examiner*—Olik Chaudhuri
*Assistant Examiner*—Yennhu B. Huynh
(74) *Attorney, Agent, or Firm*—Nixon Peabody LLP; Donald R. Studebaker

(57) ABSTRACT

After forming a first insulating film with a relatively low dielectric constant and low mechanical strength on a semiconductor substrate, a mask pattern is formed on a desired region of the first insulating film. Then, the first insulating film is patterned by conducting selective etching using the mask pattern. After forming a second insulating film with a relatively high dielectric constant and high mechanical strength on the semiconductor substrate, the second insulating film is planarized by polishing, so as to expose a face of the patterned first insulating film. An interconnect groove is formed in the patterned first insulating film, and a buried interconnect is formed in the interconnect groove.

9 Claims, 9 Drawing Sheets

METHOD FOR FABRICATING SEMICONDUCTOR DEVICE

BACKGROUND OF THE INVENTION

The present invention relates to a method for fabricating a semiconductor device, and more particularly, it relates to a method for forming a low dielectric film locally in a region of an insulating film where capacitance between interconnects is desired to be lowered.

Recently, in accordance with the increased degree of integration and the increased performance and operation speed of semiconductor integrated circuit devices, metal interconnects have been further refined and formed in structures of a larger number of levels. As one of means for attaining the refinement and the multi-level structures, a technique to use, as, an interlayer insulating film, an insulating film with a low dielectric constant (hereinafter referred to as a low dielectric insulating film) has been proposed.

When a low dielectric insulating film is used for forming an interlayer insulating film, capacitance between interconnects can be lowered so as to avoid a problem of signal delay.

However, most of currently examined low dielectric insulating films have disadvantages of weakness against impact due to low mechanical strength and a poor heat conducting property due to low thermal conductivity.

In a technique proposed for overcoming these disadvantages, a low dielectric insulating film is used in a region of an interlayer insulating film where signal delay can lead to a serious problem, and an insulating film having a high dielectric constant but having high mechanical strength and high thermal conductivity, such as a silicon oxide film, is used in a region of the interlayer insulating film where signal delay does not lead to a serious problem.

Now, a method for locally forming a low dielectric insulating film between interconnects disclosed in Japanese Laid-Open Patent Publication No. 11-135620 will be described with reference to FIGS. 9A through 9D.

First, as shown in FIG. 9A, after forming metal interconnects 11 on a semiconductor substrate 10, a resist pattern 12 is formed on a region of the semiconductor substrate 10 where capacitance between interconnects is particularly desired to be lowered.

Next, as shown in FIG. 9B, a silicon oxide film 13 is formed by liquid phase growth on a region of the semiconductor substrate 10 where the resist pattern 12 is not formed.

Then, as shown in FIG. 9C, after removing the resist pattern 12, a low dielectric insulating film 14 is formed on the entire face of the semiconductor substrate 10.

Subsequently, as shown in FIG. 9D, a portion of the low dielectric insulating film 14 present on the silicon oxide film 13 is removed by CMP, thereby placing the top faces of the silicon oxide film 13 and the low dielectric insulating film 14 at substantially the same level.

By repeatedly carrying out the aforementioned procedures, the low dielectric insulating film 14 can be selectively formed in regions where capacitance between interconnects is particularly desired to be lowered.

When the interconnect pitch is reduced as a result of reduction of semiconductor integrated circuit devices, however, it becomes difficult to fill the low dielectric insulating film between interconnects, which disadvantageously restricts the material for the low dielectric insulating film.

Also, since the low dielectric insulating film is generally poor in the mechanical strength, there arises a problem that defects such as peeling and scratch may be caused in the low dielectric insulating film in planarizing it by the CMP.

SUMMARY OF THE INVENTION

In consideration of the aforementioned conventional problems, an object of the invention is definitely forming a low dielectric insulating film between interconnects with a small interconnect pitch and preventing peeling or scratch of the low dielectric insulating film.

In order to achieve the object, the first method for fabricating a semiconductor device of this invention comprises the steps of forming, on a substrate, a first insulating film with a relatively low dielectric constant and low mechanical strength; patterning the first insulating film by selectively etching the first insulating film by using a mask pattern formed on a first region of the first insulating film; forming, on a substrate, a second insulating film with a relatively high dielectric constant and high mechanical strength; exposing a face of the patterned first insulating film by planarizing the second insulating film by polishing; forming a first interconnect groove on the patterned first insulating film; and forming a buried interconnect in the first interconnect groove.

In the first method for fabricating a semiconductor device, after forming the patterned first insulating film in the first region by patterning the first insulating film with a low dielectric constant and low mechanical strength, the second insulating film with a high dielectric constant and high mechanical strength is formed. Therefore, merely the first insulating film with a low dielectric constant can be present in the first region. Also, the face of the patterned first insulating film is exposed by planarizing the second insulating film with high mechanical strength by polishing, so as to place the top face of the second insulating film at substantially the same level as the top face of the patterned first insulating film. Therefore, defects such as peeling and scratch can be prevented from being caused in the first insulating film with low mechanical strength. Furthermore, since the buried interconnect is formed by filling the metal film in the first interconnect groove formed in the patterned first insulating film with a low dielectric constant, the first insulating film can be definitely disposed between interconnects even when the interconnect pitch is small.

The first method for fabricating a semiconductor device preferably further comprises a step of forming, on the buried interconnect, a third insulating film for preventing diffusion of a metal included in the buried interconnect.

Thus, the metal included in the buried interconnect can be prevented from diffusing into the insulating film formed thereon.

In the first method for fabricating a semiconductor device, both of the first insulating film and the second insulating film preferably include inorganic materials as principal constituents, and the step of forming the first interconnect groove preferably includes a sub-step of forming a second interconnect groove in a second region of the second insulating film.

Thus, the first interconnect groove and the second interconnect groove can be respectively formed in the first insulating film and the second insulating film through one selective etching.

Alternatively, in the first method for fabricating a semiconductor device, it is preferred that the first insulating film includes an organic material as a principal constituent and that the second insulating film includes an inorganic material as a principal constituent, and the method preferably further comprises, before or after the step of forming the interconnect groove, a step of forming a second interconnect groove in a second region of the second insulating film.

Thus, a material with a low dielectric constant can be used for the first insulating film. Also, even when the first insulating film and the second insulating film are made from different materials, the first interconnect groove and the second interconnect groove can be respectively formed in the first insulating film and the second insulating film.

In this case, the sub-step of forming the second interconnect groove is preferably carried out before the step of forming the first interconnect groove in the patterned first insulating film.

The second method for fabricating a semiconductor device of this invention comprises the steps of forming, over a substrate, a first insulating film with a relatively low dielectric constant and low mechanical strength; forming, on the first insulating film, a second insulating film with higher mechanical strength than the first insulating film; patterning the second insulating; film and the first insulating film by selectively etching the second insulating film and the first insulating film by using a first mask pattern formed on a first region of the second insulating film; forming, on the substrate, a third insulating film with a relatively high dielectric constant and high mechanical strength; exposing a face of the patterned second insulating film by planarizing the third insulating film by polishing; forming a first interconnect groove in the patterned second insulating film and the patterned first insulating film; and forming a buried interconnect in the first interconnect groove.

In the second method for fabricating a semiconductor device, after forming the patterned first insulating film in the first region by patterning the first insulating film with a low dielectric constant and low mechanical strength, the third insulating film with a high dielectric constant and high mechanical strength is formed. Therefore, the first insulating film with a low dielectric constant can be present in the first region alone. Also, after forming the second insulating film with high mechanical strength on the first insulating film with low mechanical strength, the face of the patterned second insulating film is exposed by planarizing the third insulating film by polishing so as to place the top face of the third insulating film act substantially the same level as the top face of the patterned second insulating film. Therefore, the defects such as peeling and scratch can be prevented from being caused in the first insulating film with low mechanical strength. Furthermore, since the buried interconnect is formed by filling the metal film in the first interconnect groove formed in the patterned first insulating film with a low dielectric constant, the first insulating film can be definitely disposed between interconnects even when the interconnect pitch is small.

In particular, in the second method for fabricating a semiconductor device, after forming the second insulating film with high mechanical strength on the first insulating film with low mechanical strength, the face of the patterned second insulating film is exposed by planarizing the third insulating film by polishing so as to place the top face of the third insulating film at substantially the same level as the top face of the patterned second insulating film. Accordingly, the insulating film present in the first region can be prevented from reducing in its thickness.

In the second method for fabricating a semiconductor device, the first insulating film preferably includes an organic material as a principal constituent, and the step of forming the first interconnect groove preferably includes a sub-step of forming an upper portion of the first interconnect groove in the second insulating film through etching using a second mask pattern formed on the patterned second insulating film, and removing the second mask pattern in forming a lower portion of the first interconnect groove in the first insulating film.

Thus, the removal of the mask pattern and the formation of the first interconnect groove in the patterned first insulating film can be simultaneously carried out, resulting in reducing the number of procedures.

In the second method for fabricating a semiconductor device, the second insulating film preferably has mechanical strength of 4.0 through 20.0 GPa.

Thus, scratch can be prevented from being caused in the patterned second insulating film during the planarization of the third insulating film by polishing.

In the second method for fabricating a semiconductor device, the second insulating film preferably has a dielectric constant of 3.5 through 4.5.

Thus, capacitance between interconnects can be prevented from increasing even though the second insulating film is formed on the first insulating film with a low dielectric constant.

DETAILED DESCRIPTION OF THE INVENTION

Embodiment 1

A method for fabricating a semiconductor device according to Embodiment 1 of the invention will now be described with reference to the accompanying drawings.

Figure 1A:
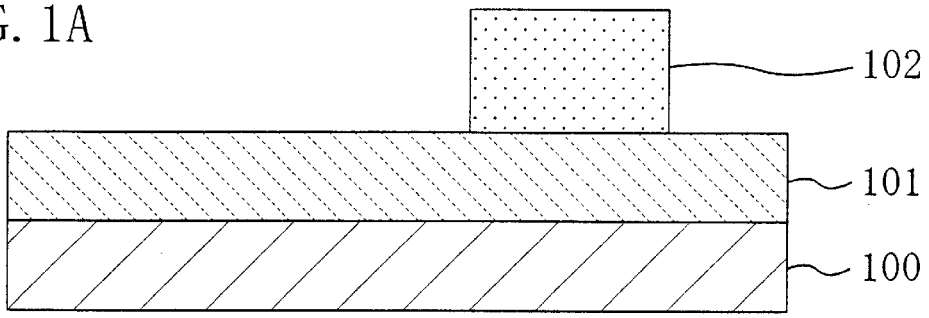
FIGS. 1A through 1C are cross-sectional views for showing procedures in a method for fabricating a semiconductor device according to Embodiment 1 of the invention.

First, as shown in FIG. 1A, a first insulating film 101 with a thickness of 500 nm of a low dielectric film including an inorganic material as a principal constituent, such as a hydrogen silsesquioxane (HSQ) film, is formed by spin coating over a semiconductor substrate 100 on which lower interconnects not shown are formed. Thereafter, a first resist pattern 102 with a thickness, of 2.0 ím is formed by known lithography on a region of the first insulating film 101 where capacitance between interconnects is particularly desired to be lowered.

Figure 1B:
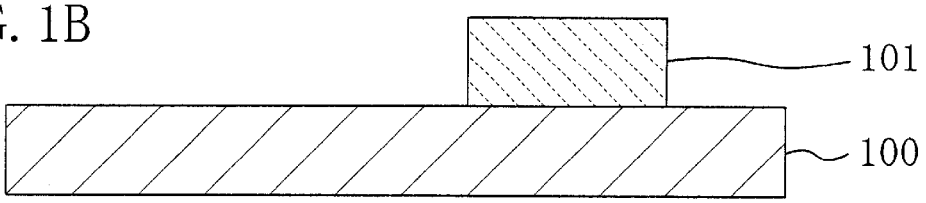

Next, the first insulating film 101 is patterned through etching by using the first resist pattern 102 as a mask and the first resist pattern 102 is then removed as shown in FIG. 1B. Thus, the first insulating film 101 remains merely on the region where capacitance between interconnects is particularly desired to be lowered.

Figure 1C:
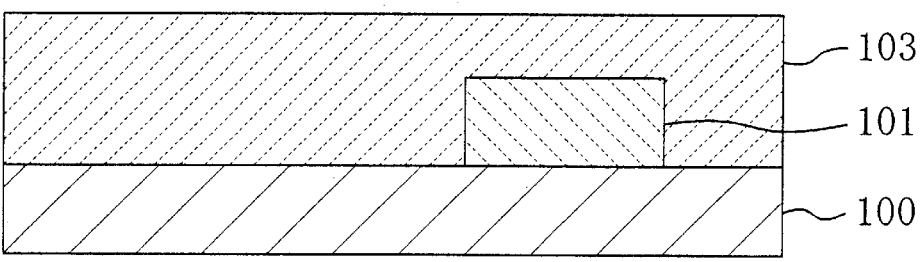
Figure 2A:
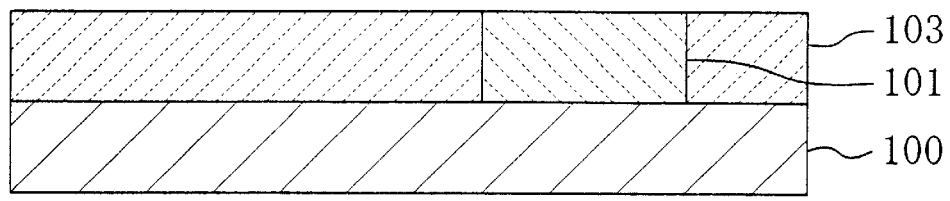
FIGS. 2A through 2C are cross-sectional views for showing other procedures in the method for fabricating a semiconductor device of Embodiment 1.

Then, as shown in FIG. 1C, a second insulating film 103 with a thickness of 700 nm of a plasma TEOS film (silicon oxide film) is formed by gas phase growth over the silicon substrate 100. Thereafter, as shown in FIG. 2A, a portion of the second insulating film 103 present on the first insulating film 101 is removed by CMP, so as to expose the face of the first insulating film 101 and place the top faces of the first insulating film 101 and the second insulating film 103 at substantially the same level.

Figure 2B:
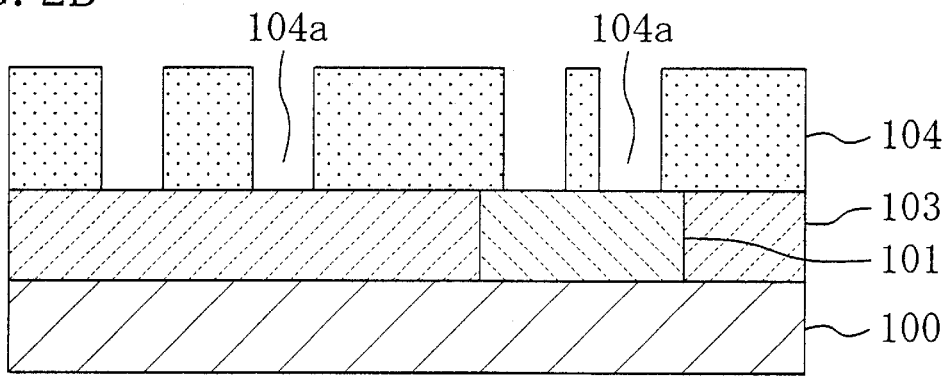
Figure 2C:
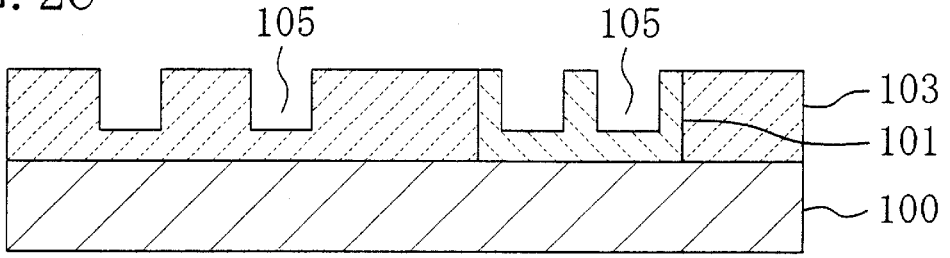

Next, as shown in FIG. 2B, a second resist pattern 104 having openings 104a in interconnect groove forming regions is formed on the first insulating film 101 and the second insulating film 103. Thereafter, the first insulating film 101 and the second insulating film 103 are etched by using an etching gas of, for example, a mixed gas of a CHF$_3$ gas and a CF$_4$ gas with the second resist pattern 104 used as a mask. Thus, interconnect grooves 105 each having a depth of approximately 250 nm are simultaneously formed in the first insulating film 101 and the second insulating film 103 as shown in FIG. 2C.

Figure 3A:
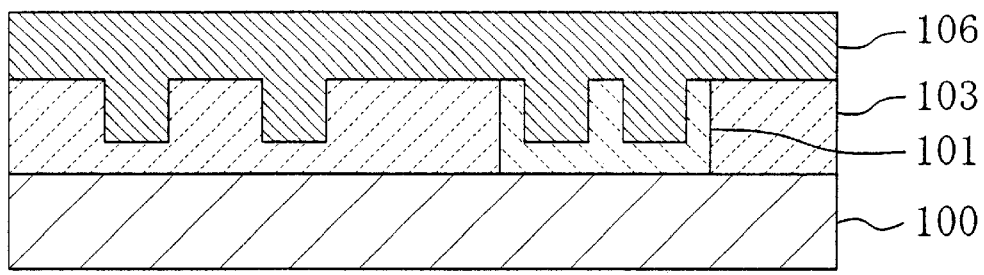
FIGS. 3A through 3C are cross-sectional views for showing still other procedures in the method for fabricating a semiconductor device of Embodiment, 1.

Subsequently, as shown in FIG. 3A, a barrier metal layer of tantalum nitride and a seed layer of copper are successively deposited over the first insulating film 101 and the second insulating film 103 including the insides of the interconnect grooves 105, and then, a copper film is grown on the seed layer by electro plating. Thus, a metal film 106 composed of the barrier metal layer, the seed layer and the copper layer is deposited so as to fill the interconnect grooves 105.

Figure 3B:
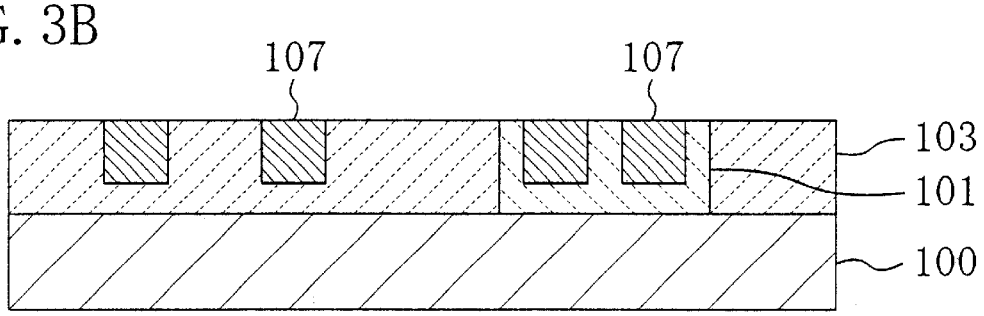
Figure 3C:
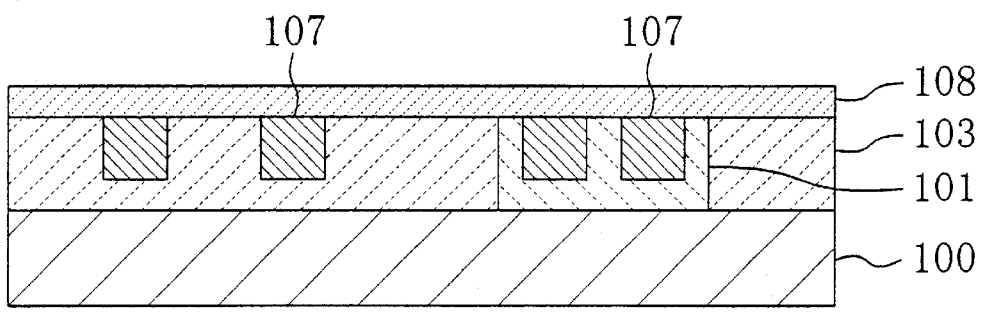

Next, as shown in FIG. 3B, a portion of the metal film 106 present on the first insulating film 101 and the second insulating film 103 is removed by the CMP, so as to form metal interconnects 107 serving as buried interconnects. Thereafter, as shown in FIG. 3C, a third insulating film 108 of a silicon carbide film with a thickness of 50 nm for preventing diffusion of copper included in the metal interconnects 107 is formed by plasma CVD on the metal interconnects 107, the first insulating film 101 and the second insulating film 103.

In the fabrication method of Embodiment 1, since there is no need to fill a low dielectric film between metal interconnects with a small interconnect pitch, a low dielectric material can be definitely disposed between the metal interconnects with a small interconnect pitch. Also, since the method does not include a step of filling a low dielectric material in a small space between the metal interconnects, the material for the low dielectric film can be selected from a wide range.

The CMP for placing the top faces of the first insulating film 101 and the second insulating film 103 at substantially the same level is carried out, after forming the first insulating film 101, on the second insulating film 103 of a silicon oxide film that is comparatively resistant to polishing. Therefore, defects such as peeling and scratch are not caused in the first insulating film 101, that is, the low dielectric film.

Modification of Embodiment 1

A method for fabricating a semiconductor device according to a modification of Embodiment 1 will now be described with reference to the accompanying drawings.

First, as shown in FIG. 1A, a first insulating film 101 with a thickness of 500 nm of a low dielectric film including an organic material as a principal constituent, such as an amorphous carbon film, is formed by the spin coating over a semiconductor substrate 100 on which lower interconnects not shown are formed. Thereafter, a first resist pattern 102 with a thickness of 2.0 ím is formed by known lithography on a region of the first insulating film 101 where capacitance between interconnects is particularly desired to be lowered.

Next, the first insulating film 101 is patterned through etching by using an etching gas of, for example, a mixed gas of a H$_2$ gas and a N$_2$ gas with the first resist pattern 102 used as a mask and the first resist pattern 102 is then removed as shown in FIG. 1B. Thus, the first insulating film 101 remains merely on the region where capacitance between interconnects is particularly desired to be lowered.

Then, as shown in FIG. 1C, a second insulating film 103 with a thickness of 700 nm of a plasma TEOS film (silicon oxide film) is formed by the gas phase growth over the silicon substrate 100. Thereafter, as shown in FIG. 2A, a portion of the second insulating film 103 present on the first insulating film 101 is removed by the CMP, so as to expose the face of the first insulating film 101 and place the top faces of the first insulating film 101 and the second insulating film 103 at substantially the same level.

Figure 4A:
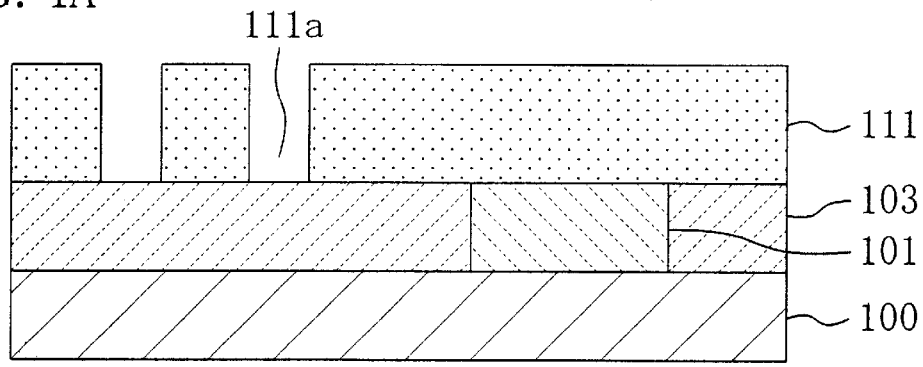
FIGS. 4A through 4D are cross-sectional views for showing procedures in a method for fabricating a semiconductor device according to modification of Embodiment 1.
Figure 4B:
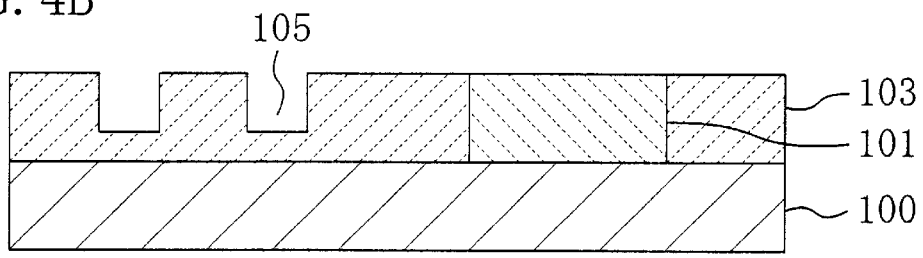

Next, as shown in FIG. 4A, a second resist pattern 111 having openings 111a correspondingly to interconnect groove forming regions of the second insulating film 103 is formed on the first insulating film 101 and the second insulating film 103. Thereafter, the second insulating film 103 is etched by using an etching gas of, for example, a mixed gas of a $CHF_3$ gas and a $CF_4$ gas with the second resist pattern 111 used as a mask. Thus, interconnect grooves 105 each having a depth of approximately 250 nm are formed in the second insulating film 103 as shown in FIG. 4B.

Figure 4C:
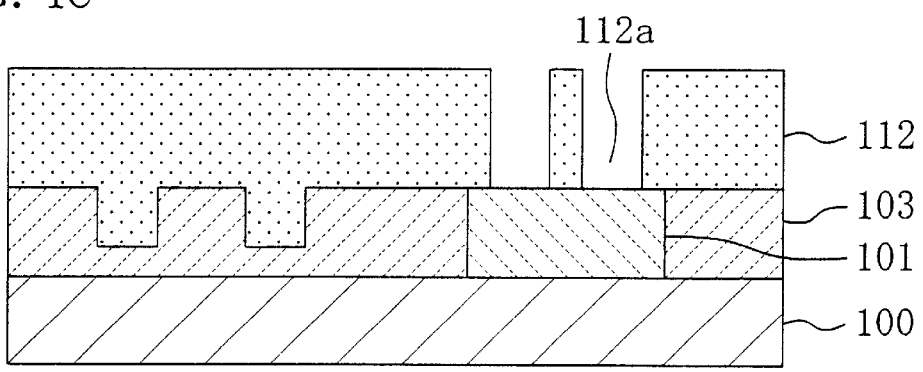
Figure 4D:
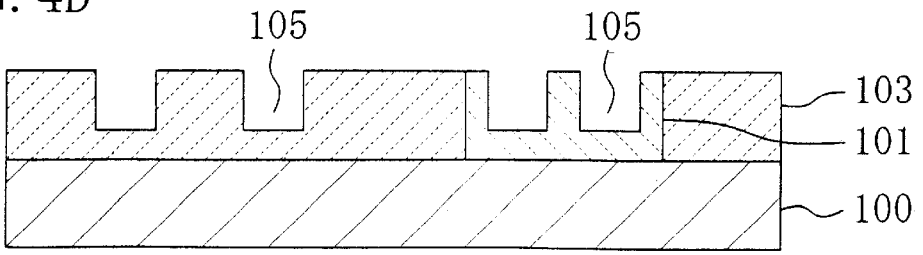

Then, as shown in FIG. 4C, a third resist pattern 112 having openings 112a correspondingly to interconnect groove forming regions of the first insulating film 101 is formed on the first insulating film 101 and the second insulating film 103. Thereafter, the first insulating film 101 is etched by using an etching gas of, for example, a mixed gas of a $H_2$ gas and a $N_2$ gas with the third resist pattern 112 used as a mask. Thus, interconnect grooves 105 each having a depth of approximately 250 nm are formed in the first insulating film 101 as shown in FIG. 4D. The interconnect grooves 105 are formed in the second insulating film 103 before forming the interconnect grooves in the first insulating film 101 because there is no need to fill the interconnect grooves 105 formed in the second insulating film 103 with the resist. In the case where the interconnect grooves 105 are formed in the first insulating film 101 before forming the interconnect grooves 105 in the second insulating film 103, the interconnect grooves 105 formed in the first insulating film 101 are filled with the resist, which should be removed from the interconnect grooves 105 in a subsequent process. Since the first insulating film 101 is formed from amorphous carbon including an organic material as a principal constituent in this modification, the amorphous carbon may be damaged in removing the resist, so that the shapes of the previously formed interconnect grooves 105 may be changed.

Subsequently, as shown in FIG. 3A, a barrier metal layer of tantalum nitride and a seed layer of copper are successively deposited over the first insulating film 101 and the second insulating film 103 including the insides of the interconnect grooves 105, and then, a copper film is grown on the seed layer by the electro plating. Thus, a metal film 106 composed of the barrier metal layer, the seed layer and the copper layer is deposited so as to fill the interconnect grooves 105.

Next, as shown in FIG. 3B, a portion of the metal film 106 present on the first insulating film 101 and the second insulating film 103 is removed by the CMP, so as to form metal interconnects 107. Thereafter, as shown in FIG. 3C, a third insulating film 108 of a silicon carbide film with a thickness of 50 nm for preventing diffusion of copper included in the metal interconnects 107 is formed by the plasma CVD on the metal interconnects 107, the first insulating film 101 and the second insulating film 103

In the modification of Embodiment 1, since there is no need to fill the low dielectric film between metal interconnects with a small interconnect pitch, the material for the low dielectric film can be selected from a wide range and the low dielectric material can be definitely disposed between the metal interconnects with a small interconnect pitch.

Also, the CMP for placing the, top faces of the first insulating film 101 and the second insulating film 103 at substantially the same level is carried out on the second insulating film 103 of a silicon oxide film, and hence, defects such as peeling and scratch are not caused in the first insulating film 101.

Although the amorphous carbon film is used as the first insulating film 101 in the modification of Embodiment 1, a carbon-containing silicon oxide film including an inorganic material as a principal constituent (siOC including 30 at % of C) may be used instead. In this case, the first insulating film 101 is etched by using an etching gas of, for example, a mixed gas of a $CHF_3$ gas, a $CF_4$ gas and a CO gas with the third resist pattern 112 used as a mask, so as to form the interconnect grooves 105 in the first insulating film 101. In the etching gas used for etching the first insulating film 101, the mixing ratio of the CO gas is larger than that in the etching gas used for etching the second insulating film 103. The etching rate can be increased by thus increasing the ratio of the CO gas.

Embodiment 2

A method for fabricating a semiconductor device according to Embodiment 2 of the invention will now be described with reference to the accompanying drawings.

Figure 5A:
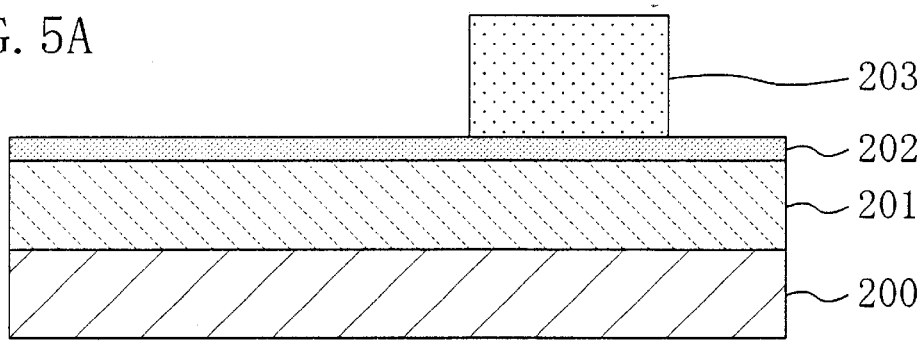
FIGS. 5A through 5D are cross-sectional views for showing procedures in a method for fabricating a semiconductor device according to Embodiment 2 of the invention.

First, as shown in FIG. 5A, a first insulating film 201 with a thickness of 500 nm of a low dielectric film including an organic material as a principal constituent, such as a polyalyether film, is formed by the spin coating over a silicon substrate 200 on which lower interconnects not shown are formed. Thereafter, a second insulating film 202 of an insulating film with high mechanical strength, such as a silicon carbide film (with mechanical strength of 8 GPa and a dielectric constant of 4.5) is formed, by the plasma CVD over the first insulating film 201. The second insulating film 202 is formed from a silicon carbide film because it has high mechanical strength and has a dielectric constant lower than that of a silicon nitride film. Then, a first resist pattern 203 with a thickness of 2.0 ìm is formed by know lithography on a region of the second insulating film 202 where capacitance between interconnects is particularly desired to be lowered.

Figure 5B:
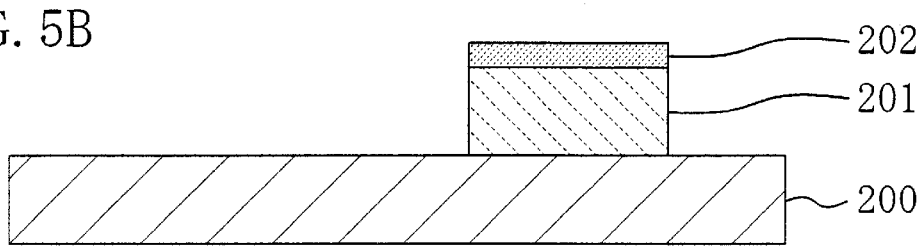

Next, the second insulating film 202 and the first insulating film 201 are etched by successively using a first etching gas, such as a mixed gas of a CO gas and a $CF_4$ gas, and a second etching gas, such as a mixed gas of a $H_2$ gas and a $N_2$ gas, with the first resist pattern 203 used as a mask. Thus, the second insulating film 202 and the first insulating film 201 are patterned, and the first resist pattern 203 is then removed as shown in FIG. 5B. In this manner, the second insulating film 202 and the first insulating film 201 remain merely on the region where capacitance between interconnects is particularly desired to be lowered.

Figure 5C:
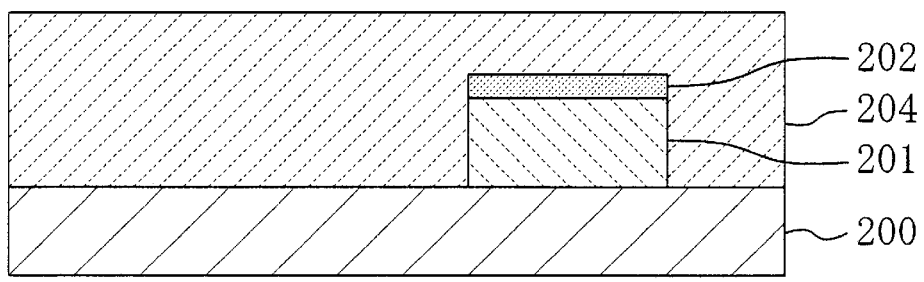
Figure 5D:
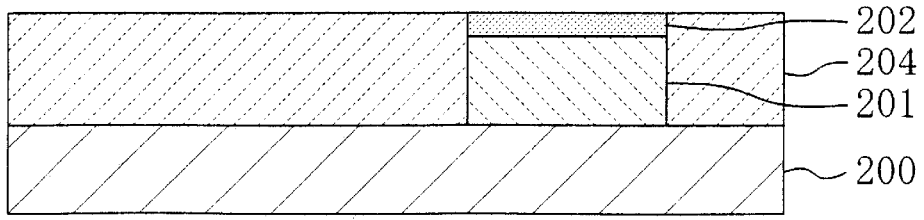

Then, as shown in FIG. 5C, a third insulating film 204 of a plasma TEOS film (silicon oxide film) with a thickness of 700 nm is formed over the silicon substrate 200 by the gas phase growth. Thereafter, a portion of the third insulating film 204 present on the second insulating film 202 is removed by the CMP, so as to place the top faces of the second insulating film 202 and the third insulating film 204 at substantially the same level as shown in FIG. 5D.

Figure 6A:
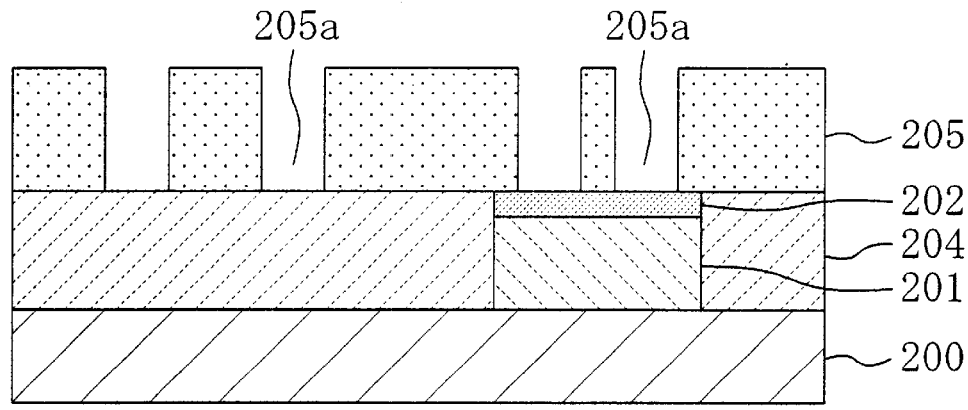
FIGS. 6A through 6C are cross-sectional views for showing other procedures in the method for fabricating a semiconductor device of Embodiment 2.

Subsequently, as shown in FIG. 6A, a second resist pattern 205 having openings 205a in interconnect groove forming regions is formed on the second insulating film 202 and the third insulating film 204.

Figure 6B:
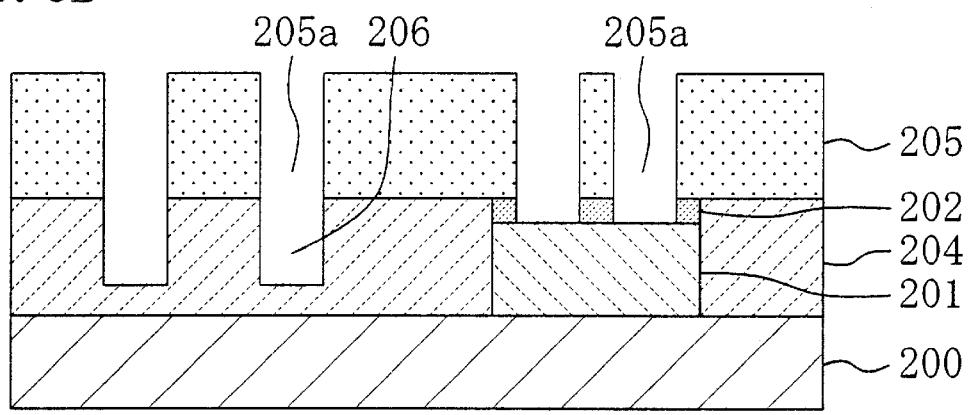

Next, the second insulating film 202 and the third insulating film 204 are etched by using an etching gas of, for example, a mixed gas of a $CHF_3$ gas and a $CF_4$ gas with the second resist pattern 205 as a mask, so as to form interconnect grooves 206 each having a depth of approximately 300 nm in the third insulating film 204 as shown in FIG. 6B. Thereafter, the $CHF_3$ gas is stopped to be supplied and a CO gas is started to be supplied, so as to pattern the second insulating film 202.

Figure 6C:
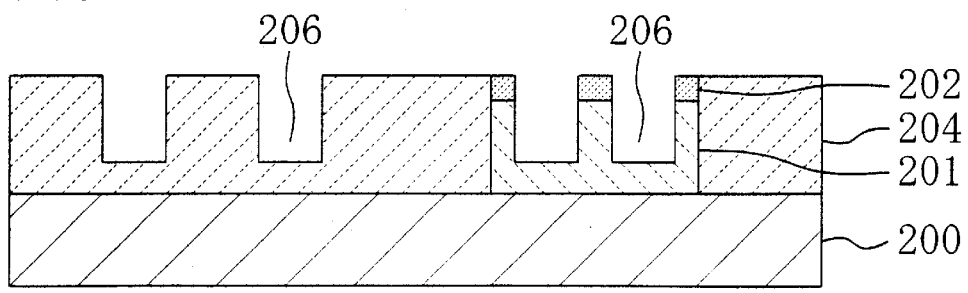

Then, the etching is carried out by using an etching gas of, for example, a mixed gas of a $H_2$ gas and a $N_2$ gas, thereby forming interconnect grooves 206 in the first insulating film 201 and removing the second resist pattern 205 as shown in FIG. 6C.

Figure 7A:
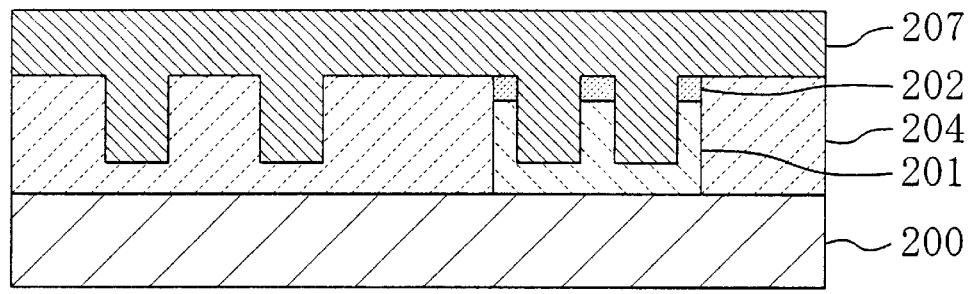
FIGS. 7A through 7C are cross-sectional views for showing still other procedures in the method for fabricating a semiconductor device of Embodiment 2.

Next, as shown in FIG. 7A, a barrier metal layer of tantalum nitride and a seed layer of copper are successively deposited over the second insulating film 202 and the third insulating film 204 including the insides of the interconnect grooves 206, and then a copper film is grown on the seed layer by the electro plating. Thus, a metal film 207 composed of the barrier metal layer, the seed layer and the copper layer is deposited so as to fill the interconnect grooves 206.

Figure 7B:
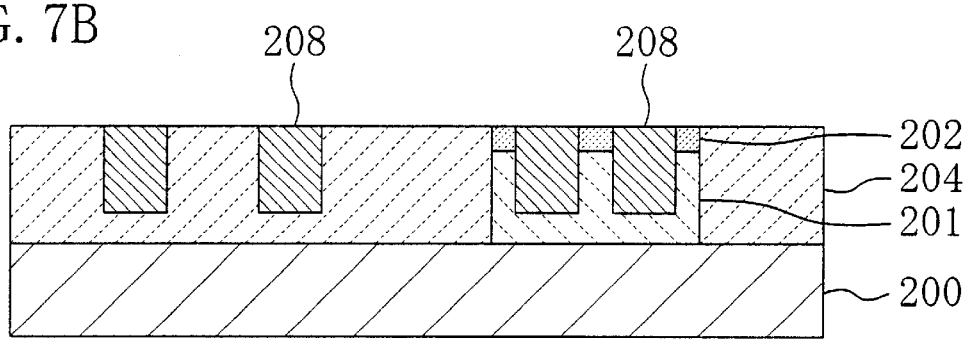
Figure 7C:
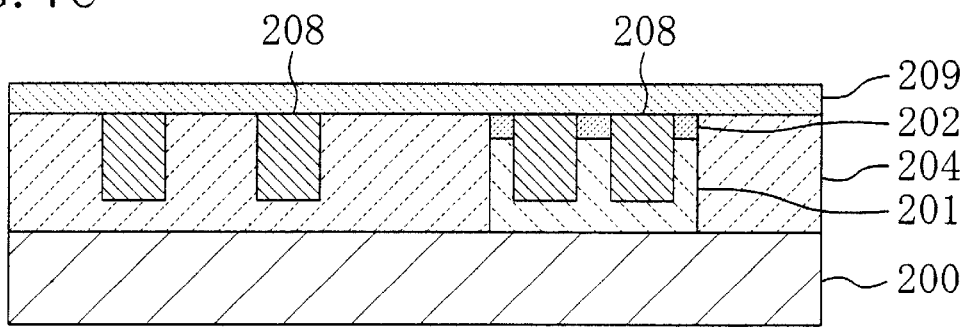

Then, as shown in FIG. 7B, a portion of the metal film 207 present on the second insulating film 202 and the third insulating film 204 is removed by the CMP, so as to form metal interconnects 208. Thereafter, as shown in FIG. 7C, a fourth insulating film 209 of a silicon carbide film with a thickness of 50 nm for preventing diffusion of copper included in the metal interconnects 208 is formed on the metal interconnects 208, the second insulating film 202 and the third insulating film 204 by the plasma CVD.

In the fabrication method of Embodiment 2, since there is no need to fill the low dielectric film between metal interconnects with a small interconnect pitch as in Embodiment 1, the material for the low dielectric film can be selected from a wide range and the low dielectric material can be definitely disposed between the metal interconnects with a small interconnect pitch.

The CMP for placing the top faces of the second insulating film 202 and the third insulating film 204 at substantially the same level is carried out on the third insulating film 204 of a silicon oxide film, and hence, defects such as peeling and scratch are not caused in the first insulating film 201, that is, the low dielectric film.

Furthermore, since the second insulating film 202 with high mechanical strength is formed on the first insulating film 201 with low mechanical strength, the thickness of the low dielectric film composed of the first insulating film 201 and the second insulating film 202 can be prevented from reducing during the CMP carried out for polishing the third insulating film 204.

Although the polyalylether film is used as the first insulating film 201 in Embodiment 2, an amorphous carbon film including an organic material as a principal constituent may be used instead. In this case, a mixed gas of a $H_2$ gas and a $N_2$ gas may be used as the etching gas.

Alternatively, a carbon-containing silicon oxide film may be used as the first insulating film 201 of Embodiment 2 instead of the polyalylether film. In this case, a mixed gas of a $CHF_3$ gas and $CF_4$ gas is preferably used as the etching gas.

Also, the second insulating film 202 of Embodiment 2 may be formed from a silicon nitrided oxide film including an inorganic material as a principal constituent (with mechanical strength of 10 through 15 GPa and a dielectric constant of 5.0 through 6.0) instead of the silicon carbide film. The mechanical strength and the dielectric constant of the silicon nitrided oxide film are varied depending upon mixing ratios of oxygen and nitrogen. In this case, a mixed gas of a $CHF_3$ gas and a $CF_4$ gas can be used as the etching gas.

Alternatively, the second insulating film 202 of Embodiment 2 may be formed from a silicon nitride film including an inorganic material as a principal constituent (with mechanical strength of 20 GPa and a dielectric constant of 7.0) instead of the silicon carbide film. In this case, a mixed gas of $CHF_3$ gas and a $CF_4$ gas can be used as the etching gas.

Figure 8:
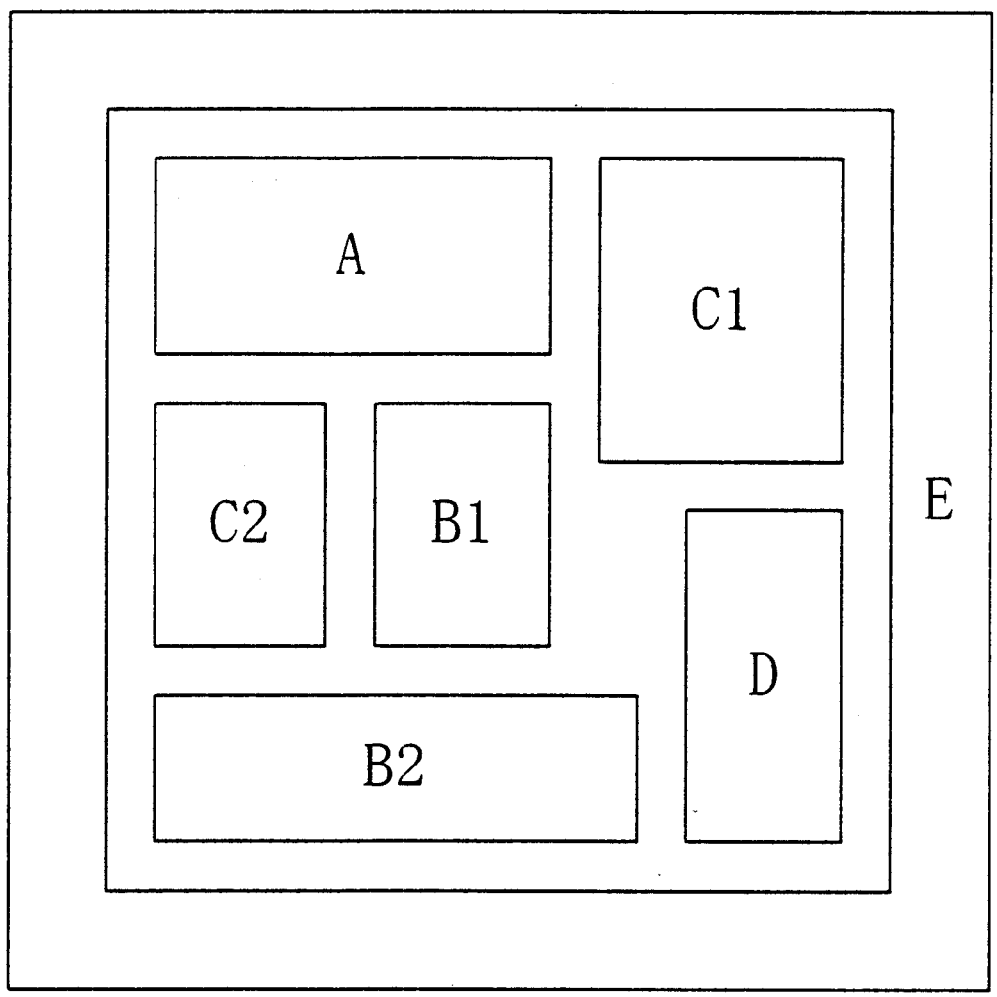
FIG. 8 is a plane view for explaining a region where capacitance between interconnects is particularly desired to be lowered in a semiconductor integrated circuit device.
Figure 9A:
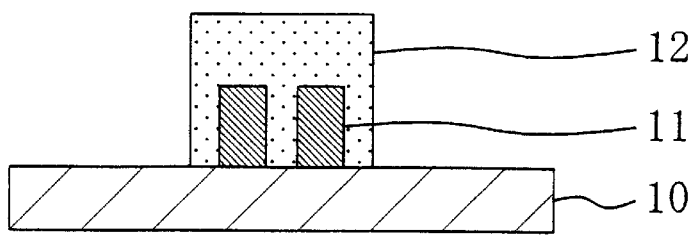
FIGS. 9A through 9D are cross-sectional views for showing procedures in a conventional method for fabricating a semiconductor device.
Figure 9B:
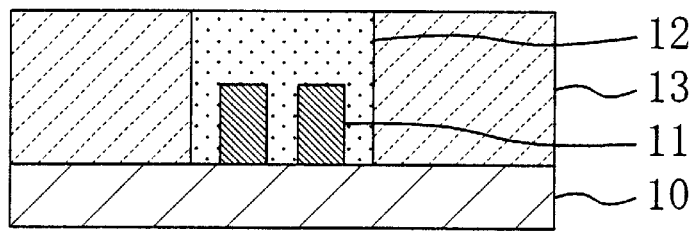
Figure 9C:
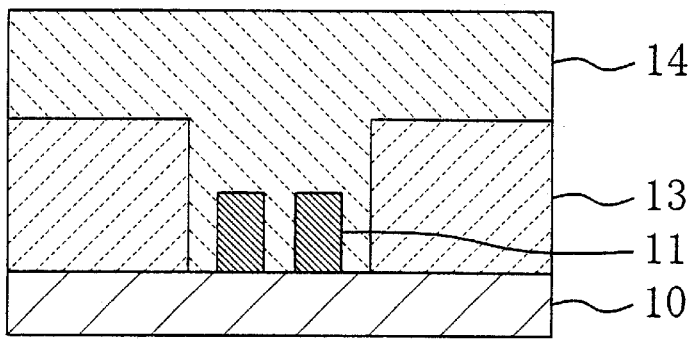
Figure 9D:
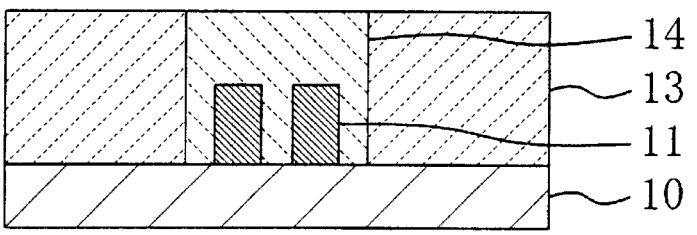

FIG. 8 shows an example of the layout of a semiconductor integrated circuit device (system LSI chip), in which a CPU core block A, a logic circuit block B1, a logic circuit block B2, a DRAM array block C1, a DRAM array block C2 and an SRAM array block D are provided on a silicon substrate. In the peripheral portion on the silicon substrate, a bonding pad region E is provided so as to surround these functional blocks. In such a semiconductor integrated circuit device, interconnects for mutually connecting the functional blocks (block-to-block interconnects) are formed.

In each of the aforementioned embodiments, the block-to-block interconnects for connecting functional blocks are formed in the region where the low dielectric film is formed. As a result, interconnect speed can be secured in regions between the functional blocks where interconnect delay leads to a serious problem.

In this manner, the block-to-block interconnects are formed in the region where the low dielectric film is formed in each of the embodiments, thereby lowering capacitance between interconnects and preventing interconnect delay.

Furthermore, in each of the embodiments, the bonding pad region is formed not from a low dielectric film but from a silicon oxide film with high mechanical strength because large stress is applied to this region, in a bonding process.

What is claimed is:

1. A method of fabricating a semiconductor device comprising the steps of:

forming, on a substrate, a first insulating film with a relatively low dielectric constant and low mechanical strength;

patterning said first insulating film by selectively etching said first insulating film by using a mask pattern formed on a first region of said first insulating film;

forming, on said substrate and said patterned first insulating film, a second insulating film with a relatively high dielectric constant and high mechanical strength;

exposing a face of said patterned first insulating film by planarizing said second insulating film by polishing;

forming a first interconnect groove in said patterned first insulating film; and forming a buried interconnect in said first interconnect groove.

2. The method for fabricating a semiconductor device of claim 1, further comprising a step of forming, on said buried interconnect, a third insulating film for preventing diffusion of a metal included in said buried interconnect.

3. The method for fabricating a semiconductor device of claim 1, wherein both of said first insulating film and said second insulating film include inorganic materials as principal constituents, and the step of forming said first interconnect groove includes a sub-step of forming a second interconnect groove in a second region of said second insulating film.

4. The method for fabricating a semiconductor device of claim 1, wherein said first insulating film includes an organic material as a principal constituent and said second insulating film includes an inorganic material as a principal constituent, and the method further comprises, before or after the step of forming said interconnect groove, a step of forming a second interconnect groove in a second region of said second insulating film.

5. The method for fabricating a semiconductor device of claim 4, wherein the sub-step of forming said second interconnect groove is carried out before the step of forming said first interconnect groove in said patterned first insulating film.

6. A method of fabricating a semiconductor device comprising the steps of:

forming, over a substrate, a first insulating film with a relatively low dielectric constant and low mechanical strength;

forming, on said first insulating film, a second insulating film with higher mechanical strength than said first insulating film;

patterning said second insulating film and said first insulating film by selectively etching said second insulating film and first insulating film by using a first mask pattern formed on a first region of said second insulating film;

forming, on said substrate, said patterned second insulating film and said patterned first insulating film, a third insulating film with a relatively high dielectric constant and high mechanical strength;

exposing a face of said patterned second insulating film by planarizing said third insulating film by polishing;

forming a first interconnect groove in said patterned second insulating film and said patterned first insulating film; and forming a buried interconnect in said first interconnect groove.

7. The method for fabricating a semiconductor device of claim 6, wherein said first insulating film includes an organic material as a principal constituent, and the step of forming said first interconnect groove includes a sub-step of forming an upper portion of said first interconnect groove in said second insulating film through etching using a second mask pattern formed on said patterned second insulating film, and removing said second mask pattern in forming a lower portion of said first interconnect groove in said first insulating film.

8. The method for fabricating a semiconductor device of claim 6, wherein said second insulating film has mechanical strength of 4.0 through 20.0 GPa.

9. The method for fabricating a semiconductor device of claim 6, wherein said second insulating film has a dielectric constant of 3.5 through 4.5.

* * * * *